US007283039B2

(12) United States Patent
Ratner

(10) Patent No.: US 7,283,039 B2
(45) Date of Patent: Oct. 16, 2007

(54) WINDOW-ATTACHED ALERTING DEVICE

(76) Inventor: David L. Ratner, 1122 6th St., Apt. 205, Santa Monica, CA (US) 90403

( * ) Notice: Subject to any disclaimer, the term of this patent is extended or adjusted under 35 U.S.C. 154(b) by 183 days.

(21) Appl. No.: 11/314,144

(22) Filed: Dec. 22, 2005

(65) Prior Publication Data

US 2007/0146122 A1 Jun. 28, 2007

(51) Int. Cl.
*G08B 3/00* (2006.01)
*G01R 27/26* (2006.01)

(52) U.S. Cl. .................................... 340/384.1; 324/658

(58) Field of Classification Search ............. 340/348.1, 340/286.06, 545; 345/174; 324/658
See application file for complete search history.

(56) References Cited

U.S. PATENT DOCUMENTS 5,164,705 A * 11/1992 Dunagan et al. ............ 340/547
6,794,728 B1 * 9/2004 Kithil ......................... 257/532
6,885,301 B2 * 4/2005 Park ........................... 340/541

* cited by examiner

*Primary Examiner*—Daniel Wu
*Assistant Examiner*—Sigmund Tang
(74) *Attorney, Agent, or Firm*—Albert O. Cota

(57) ABSTRACT

A window-attached alerting device (10) having an electronics circuit (12) that is enclosed within an alerting device enclosure (40) that includes an outer side (42) and an inner side (44). The outer side (42) is removably attached to an inner surface (62) of a windowpane (60) that is attached to a building. Since the enclosure (40) is attached to the inside of the building, the enclosure is not exposed to inclement weather or to theft. The outer side (42) of the enclosure (40) is visible through the windowpane (60) and includes indicia (52) in the form of a target (54) or the like that is positioned to encompass an electrode (22). When a person places his/her finger or hand proximate to the target (54) the electrode, in combination with the electronics circuit (12), produces an alerting device signal 31 that can be easily heard within the building.

20 Claims, 4 Drawing Sheets

WINDOW-ATTACHED ALERTING DEVICE

TECHNICAL FIELD

The invention generally pertains to alerting devices, and more particularly to an audio alerting device that is attached to an inner surface of a windowpane through which is visible a device activation target. When a person touches the outside of the windowpane at the area encompassing the device activation target, the audio alerting device is activated.

BACKGROUND ART

The use of an alerting device to indicate that a person wishes to enter a home or a commercial building is in widespread use. Typical alerting devices include hard-wired chimes, bells or buzzers that are located within a home or a building and that are activated by a person from the outside of the home or the building structure.

The use of portable alerting devices that can be easily moved from one location to another and that are easily attached to an inner surface of a structure e.g., an inner surface of a windowpane was not found in the prior art. However, the following U.S. patents are considered related:

| U.S. Pat. No. | INVENTOR | ISSUED |
|---|---|---|
| 6,897,765 | Kaje | 24 May 2005 |
| 5,894,262 | McCavit, et al | 13 Apr. 1999 |
| 4,764,953 | Chern, et al | 16 Aug. 1988 |
| 3,624,646 | Weiss | 30 Nov. 1971 |

The U.S. Pat. No. 6,897,765 patent discloses a remote control device that when actuated by a user transmits a coded signal to a sensor. The sensor is associated with a doorbell that receives the signal and causes activation of the doorbell. The sensor has multiple settings which control operSation of the doorbell.

The U.S. Pat. No. 5,894,262 patent discloses a doorbell circuit that detects when one of a plurality of doorbell switches is depressed and provides an audible indication for each specific doorbell switch that is depressed. The doorbell circuit includes a detector circuit that is connected in parallel across one of the doorbell switches.

The U.S. Pat. No. 4,764,953 patent discloses an apparatus for providing remote answering of a doorbell. The apparatus includes a circuit for receiving a doorbell signal indicative that a doorbell switch has been actuated. An autodialing circuit is coupled to and is responsive to the receiving circuit and a telephone line for dialing a telephone number responsive to the doorbell signal. An alerting circuit generates an alert signal to be transmitted over the telephone line to the telephone number dialed by the autodialing circuit. The alert signal then alerts a party answering the remote telephone to the fact that the party is responding to a doorbell rather than a normal telephone call.

The U.S. Pat. No. 3,624,646 patent discloses a thermometer/chime combination. The usual chime circuitry is modified to indicate the outdoor temperature during the period of time that the chime is not in actual use. Thus, the composite circuitry, which normally indicates the temperature, sounds the chime tone when an exterior pushbutton switch is activated.

For background purposes and as indicative of the art to which the invention relates, reference may be made to the following remaining patents found in the search:

| PATENT NO. | INVENTOR | ISSUED |
|---|---|---|
| 6,883,099 | Terrell, et al | 19 Apr. 2005 |
| 6,600,117 | Gretz | 29 Jul. 2003 |
| 3,587,094 | Scott | 22 Jun. 1971 |

DISCLOSURE OF THE INVENTION

The window-attached alerting device, which is also known as WindowBell™, is designed for use with any glass door or window that is attached to a building such as a home, office or storefronts. The inventive window-attached alerting device instantly provides a doorbell type device without requiring the use of external wiring, drilling holes or the need to have an additional alerting device attachment structure attached to an outer surface of the building. Any building can have at least one additional alerting device attached to any glass door or window.

In its basic design configuration the window-attached alerting device functions in combination with a windowpane that is located within a window frame that is attached to a building, and that includes an inner surface and an outer surface. The window-attached alerting device is comprised of:

A. An alerting device enclosure having an outer side and an inner side. The outer side has an enclosure/window attachment means, such as double-sided adhesive tape, which allows the enclosure to be releasably attached to the inner surface (inside) of the windowpane. Since the alerting device enclosure is attached inside a building it is protected from inclement weather or theft.

B. A battery-powered electronics circuit that is located within the alerting device enclosure and that has circuit means for producing an audible alerting device signal that is activated by an electrode, which is located on an inner surface of the inner side of the alerting device enclosure. The electrode is activated from the outer surface (outside) of the windowpane when a person's finger or hand or other capacitively conductive material is placed proximate to an area of the windowpane that encompasses the location of the electrode.

The activated electrode produces a signal that allows the window-attached alerting device to produce a selectable "DING DONG" or "DONG DING" chime.

In view of the above disclosure, the primary object of the invention is to produce an alerting device having an electronics circuit that includes an alerting device activating electrode. The alerting device is located within an alerting device enclosure that is attached to an inner surface of a windowpane. The alerting device is activated when a person places his/her finger or hand on an outer surface of the windowpane on an area that encompasses the location of the electrode.

In addition to the primary object of the invention, it is also an object of the invention to produce a window/attached alerting device that:

- is protected from inclement weather and from theft,
- the enclosure can be made in various colors and shapes,
- the front of the electronics enclosure can include indicia that indicates the location of the electrode,
- the indicia can include various company logos, animated faces or a target,
- is portable and easy to install,
- is cost effective from both a manufacturer's and consumer's point of view.

These and other objects and advantages of the present invention will become apparent from the subsequent detailed description of the preferred embodiment and the appended claims taken in conjunction with the accompanying drawings.

BEST MODE FOR CARRYING OUT THE INVENTION

Figure 1:
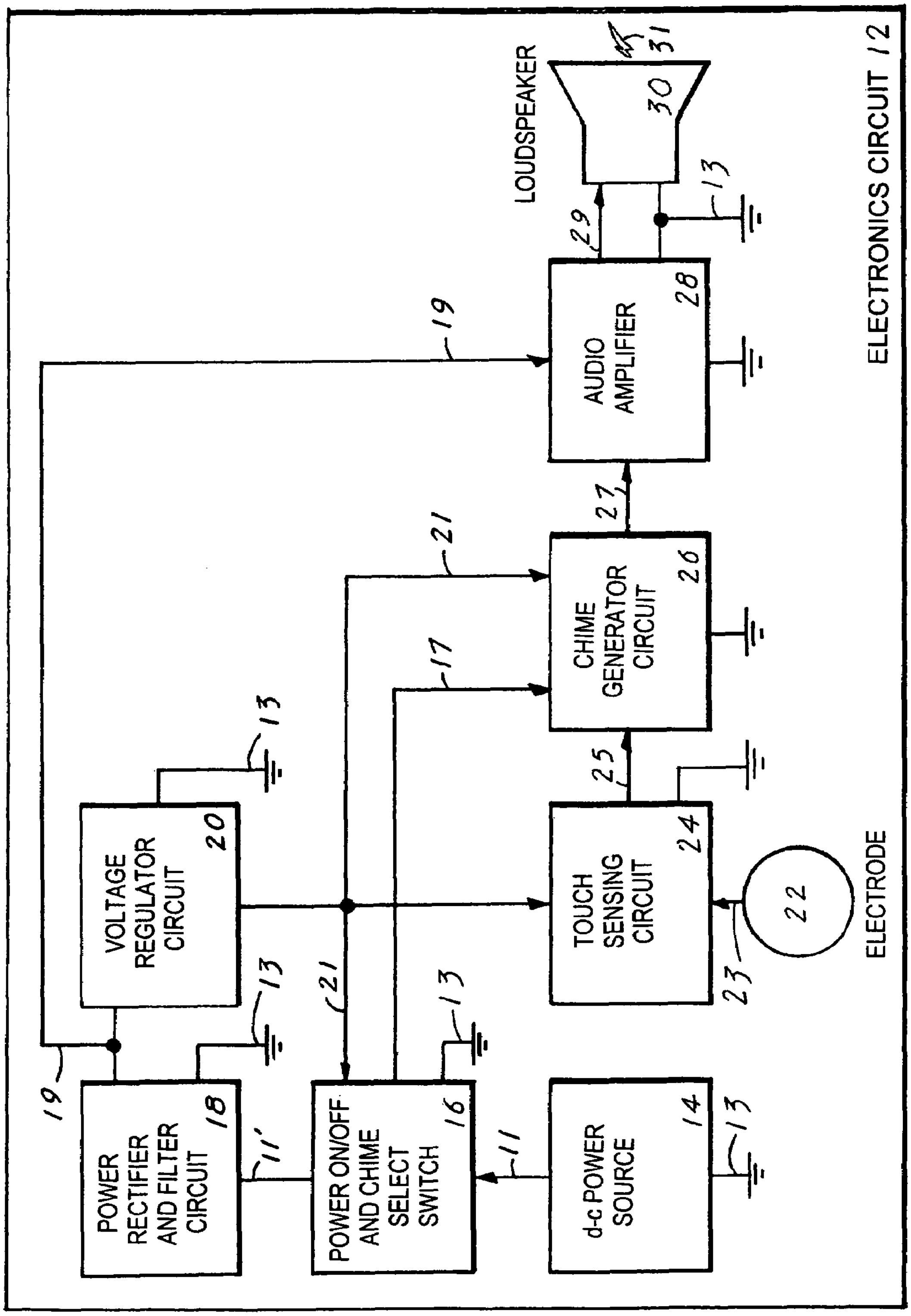
FIG. 1 is a block diagram of a first design for a window-attached alerting device.

The best mode for carrying out the window-attached alerting device is presented in terms of a preferred embodiment that is disclosed in three design configurations. All three configurations have a commonality in that the electronics circuit that operates the alerting device is located within an enclosure that includes an outer side and an inner side. The outer side is removably attached to the inner surface of a windowpane, which allows the inner side of the enclosure to extend from the inner surface of the windowpane. To activate the window-attached alerting device a person simply places his/her finger or hand proximate to indicia such as a target that is placed on the outer side of the alerting device enclosure and that is visible through the windowpane. The alerting device can consist of a chime, a buzzer, an audio message, or the like. However, for purposes of brevity, only an alerting device consisting of a chime and a buzzer are disclosed.

The first design configuration which is also the preferred embodiment of the window-attached alerting device 10, as shown in FIGS. 1-4, is comprised of two major elements: an electronics circuit 12 and an alerting device enclosure 40.

The electronics circuit 12 is comprised of the following nine components: a d-c power source 14, a power ON/OFF and chime select switch 16, a power rectifier and filter circuit 18, a voltage regulator circuit 20, an electrode 22, a touch sensing circuit 24, a chime generator circuit 26, an audio amplifier 28, and a loudspeaker 30. The alerting device enclosure 40 is comprised of an outer side 42, an inner side 44, an enclosure/window attachment means 46, and indicia 52. The alerting device 10 functions in combination with a windowpane 60 having an inner surface 62 and an outer surface 64. Note that the electronic elements are designated with even numbers and the corresponding signals are designated in odd numbers.

The d-c power source 14, as shown in FIG. 1, has means for producing a d-c supply voltage 11 that can range from 3 to 30 volts. Preferably, the d-c supply voltage 11 is provided by a 9-volt battery. The d-c supply voltage is controlled by the power ON/OFF and chime select switch 16, which is comprised of a double-pole, double-throw, center off switch that preferably consists of a slide switch. The switch 16 includes a first pair of contacts (A) and (B) that are selected by a first pole (P1), and a second pair of contacts (C) and (D) that are selected by a second pole (P2). The contacts (A) and (B) are connected together and are applied the d-c supply voltage 11 from the d-c power source 14. The contact (C) is connected to circuit ground 13, and the contact (D) is applied a regulated d-c voltage ranging from 3 to 5 volts from the voltage regulator circuit 20 as described infra. The first pole (P1) is ganged to the second pole (P2). From the first pole (P1) is produced a switched d-c supply voltage 11', and from the second pole (P2) is produced a chime generated mode select signal 17.

The power rectifier and filter circuit 18, as shown in FIG. 1, is applied the switched d-c supply voltage 11'. The circuit 18 has means for filtering the switched d-c supply voltage 11' applied from the pole (P1) of the switch 16 and subsequently producing a filtered d-c voltage 19. The power rectifier and filter circuit 18, as the title implies, is designed to accept the switched d-c supply voltage 11' or an a-c voltage. The a-c voltage is subsequently rectified by a diode to produce a filtered d-c voltage 19.

The voltage regulator circuit 20 is applied the filtered d-c voltage 19 from the circuit 18 and is designed to produce a regulated d-c voltage 21 ranging from 3 to 5 volts. This regulated d-c voltage 21 is applied to the contact (D) of the power ON/OFF and chime select switch 16, to the touch sensing circuit 24, and to the chime generator circuit 26. The voltage regulator circuit 20 in the preferred design is comprised of a low-dropout adjustable voltage regulator that maximizes the useful life of the 9-volt battery.

Figure 2:
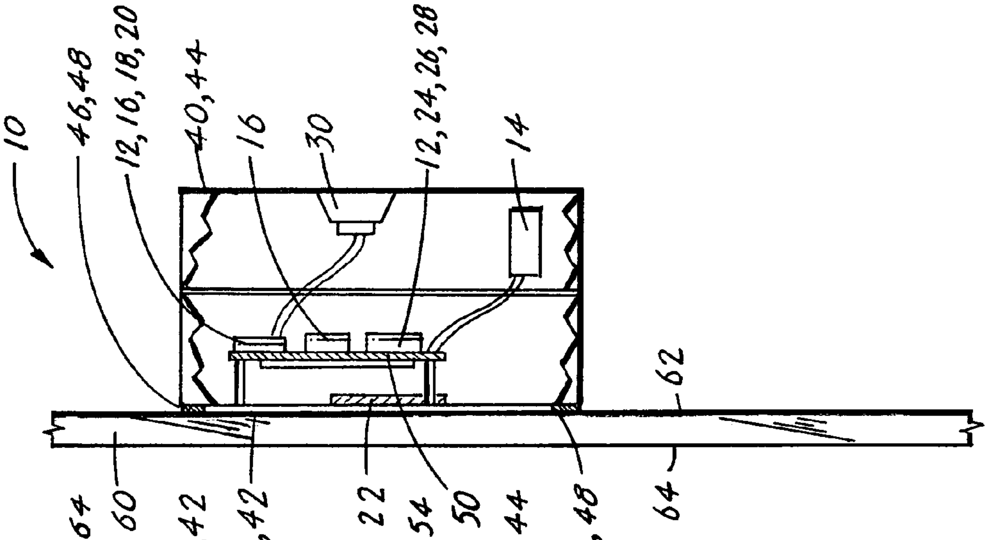
FIG. 2 is an elevational-cutaway view of an alerting device enclosure attached to an inner surface of a windowpane.
Figure 3:
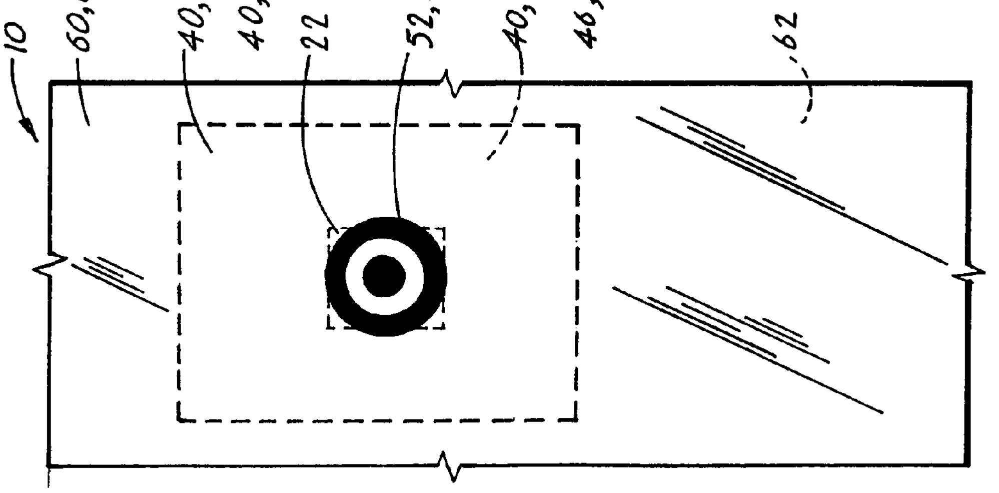
FIG. 3 is a front elevational view of the alerting device enclosure attached to the inner surface of the windowpane.

The electrode 22, as shown in FIGS. 1, 2 and 3, is comprised of a metal that has a high dielectric constant. The electrode 22 is attached to the inside of the outer side 42 of the electronics enclosure 40. When a finger or hand is placed proximate to an area on the electronics enclosure 40 that encompasses the electrode 22, the electrode 22 senses a change in capacitance. This change in capacitance causes the electrode 22 to produce a sensor activation signal 23.

The touch sensing circuit 24, as shown in FIG. 1, is applied the regulated d-c voltage 21 from the voltage regulator circuit 20, and the sensor activation signal 23 from the electrode 22. The circuit 24 incorporates an integrated circuit that includes a capacitance to digital converter (CDC) that, when the circuit 24 is applied the sensor activation signal 23, a chime activation signal 25 is produced.

The chime generator circuit 26 is applied the regulated d-c voltage 21 from the voltage regulator circuit 20, and the chime generator mode select signal 17 applied from the pole (P2) on the power ON/OFF chime select switch 16. The circuit 26 includes a flash microcontroller that is activated when the chime activation signal 25 is applied, and depending upon the position of the pole (P2), the ON/Off chime select switch 16 will produce a chime audio signal 27. When the pole (P2) is making contact with the contact (C) (circuit ground), the chime generator circuit 26 produces a “DING DONG” sound. When the pole (P2) is making contact with the contact (D) (high), the circuit 26 produces a “DONG DING” sound.

The final two elements that comprise the first design configuration of the preferred embodiment are the audio amplifier 28 and the loudspeaker 30. The amplifier 28 is applied the filtered d-c voltage 19 from the power rectifier and filter circuit 18, and the chime audio signal 27 from the chime generator circuit 26. The amplifier 28 then produces an amplified audio signal 29 that is applied to the loudspeaker 30 from where the alerting device signal 31 is heard.

Figure 4:
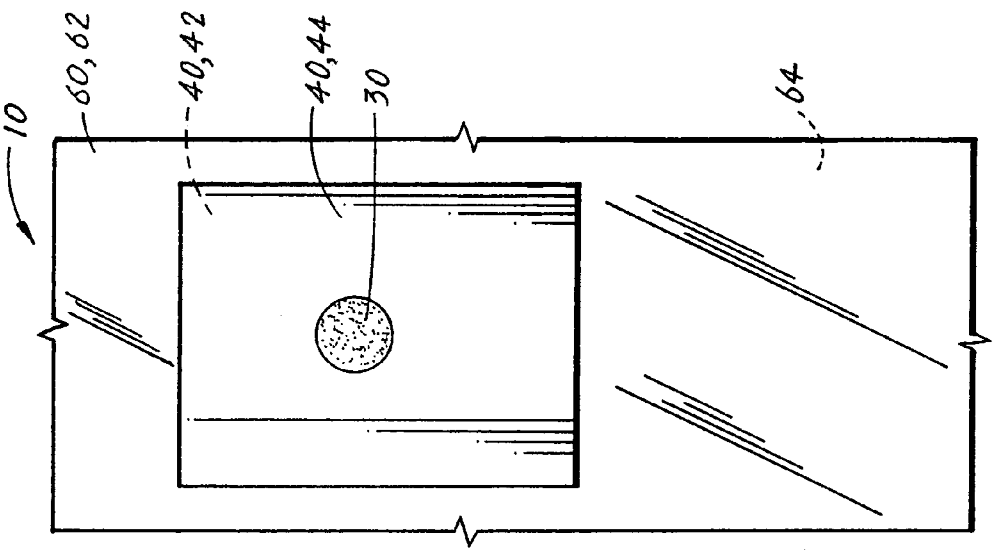
FIG. 4 is a rear elevational view of the alerting device enclosure attached to the inner surface of the windowpane.

The second major element of the window-attached alerting device 10 is the alerting device enclosure 40, as shown in FIGS. 2, 3 and 4. The enclosure 40 is dimensioned to enclose a printed circuit board (PCB) 50 to which is attached the major components that comprise the electronics circuit 12.

The alerting device enclosure 40 is comprised of an outer side 42 that is removably attached to an inner side 44, as shown in FIG. 2. As also best shown in FIG. 2, the enclosure 40 includes an enclosure/window attachment means 46 that preferably consists of a double-sided adhesive tape 48. The tape (48) is attached to the outer side of the enclosure 40, preferably near the upper edge and lower edge of the outer side 42. When the outer side 42 is pressed against the inner surface 62 of the windowpane 60, the two-sided adhesive tape 48 securely attaches the alerting device enclosure 40 to the windowpane 60.

The outer side 42 of the alerting device enclosure 40 further comprises indicia 52, preferably in the form of a target 54, as shown in FIG. 3. The target 54 is located so that it encompasses the location of the electrode 22. The indicia target 54 allows a person to place his/her finger or hand at an optimum location to activate the window-attached alerting device 10.

The second design configuration of the window-attached alerting device 10, as shown in FIGS. 2-5, is also comprised of two major elements: an electronics circuit 12 and an alerting device enclosure 40. The difference between the first design configuration and the second design configuration is that the power rectifier and filter circuit 18 and the voltage regulator 20 have been eliminated from the second design configuration.

Figure 5:
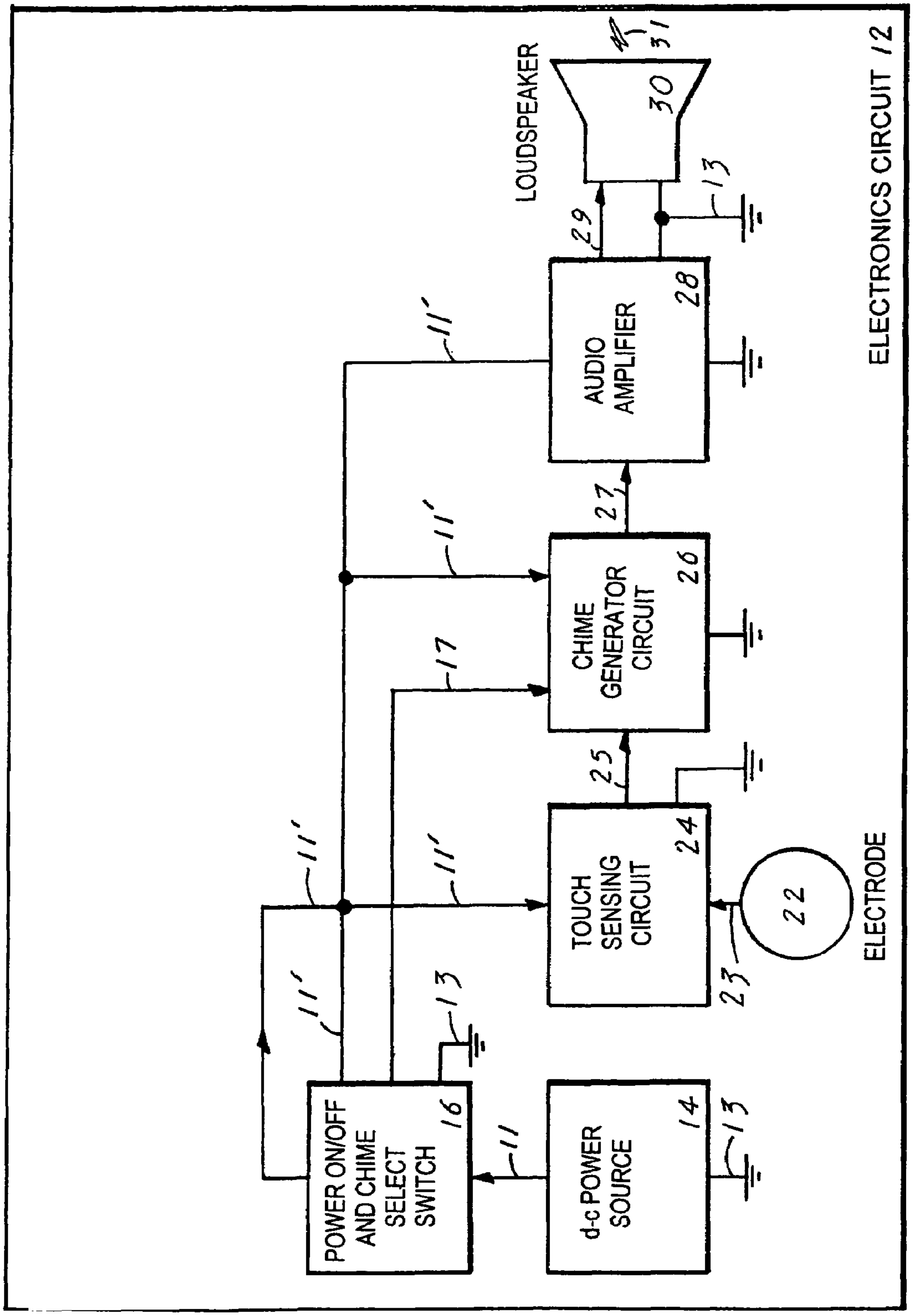
FIG. 5 is a block diagram of a simplified design of the window-attached alerting device shown in FIG. 1.

The electronics circuit 12, as shown in FIG. 5, is comprised of the following seven components: a d-c power source 14, a power ON/OFF and chime select switch 16, an electrode 22, a touch sensing circuit 24, a chime generator circuit 26, an audio amplifier 28, and a loudspeaker 30. The alerting device enclosure 40 is comprised of an outer side 42, an inner side 44, an enclosure/window attachment means 46, and indicia 52. The alerting device 10 functions in combination with a windowpane 60 having an inner surface 62 and an outer surface 64.

The d-c power source 14, as shown in FIG. 5, has means for producing a d-c supply voltage 11 that can range from 3 to 30 volts. Preferably, the d-c supply voltage 11 is provided by a 9-volt battery. The d-c supply voltage is controlled by the power ON/OFF and chime select switch 16, which is comprised of a double-pole, double-throw, center off switch that preferably consists of a slide switch. The switch 16 includes a first pair of contacts (A) and (B) that are selected by a first pole (P1), and a second pair of contacts (C) and (D) that are selected by a second pole (P2). The contacts (A) and (B) are connected together and are applied the d-c supply voltage 11 from the d-c power source 14. The contact (C) is connected to circuit ground 13. The first pole (P1) is ganged to the second pole (P2). From the first pole (P1) is produced a switched d-c supply voltage 11', which is applied to the contact (D), and from the second pole (P2) is produced a chime generated mode select signal 17.

The electrode 22, as shown in FIGS. 2, 3 and 5, is comprised of a metal that has a high dielectric constant. The electrode 22 is attached to the inside of the outer side 42 of the electronics enclosure 40. When a finger or hand is placed proximate to an area on the electronics enclosure 40 that encompasses the electrode 22, the electrode 22 senses a change in capacitance. This change causes the electrode 22 to produce a sensor activation signal 23.

The touch sensing circuit 24, as shown in FIG. 5, is applied the switched d-c voltage 11' from the pole (P1) of the switch 16, and the sensor activation signal 23 from the electrode 22. The circuit 24 incorporates an integrated circuit that includes a capacitance to digital converter (CDC) that, when the circuit 24 is applied the sensor activation signal 23, a chime activation signal 25 is produced.

The chime generator circuit 26 is applied the switched d-c voltage 11' from the pole (P1) on the switch 16, and the chime generator mode select signal 17 applied from the pole (P2) on the switch 16. The circuit 26 includes a flash microcontroller that is activated when the chime activation signal 25 is applied, and depending upon the position of the pole (P2), the power ON/Off chime select switch 16 will produce a chime audio signal 27.

When the pole (P2) is making contact with the contact (C) (circuit ground), the chime generator circuit 26 produces a "DING DONG" sound. When the pole (P2) is making contact with the contact (D) (high), the circuit 26 produces a "DONG DING" sound.

The final two elements that comprise the second design configuration of the preferred embodiment are the audio amplifier 28 and the loudspeaker 30. The amplifier 28 is applied the switched d-c voltage 11' from the pole (P1) of the switch 16, and the chime audio signal 27 from the chime generator circuit 26. The amplifier 28 then produces an amplified audio signal 29 that is applied to the loudspeaker 30 from where the alerting device signal 31 is heard.

The second major element of the window-attached alerting device 10 is the alerting device enclosure 40, as shown in FIGS. 2, 3 and 4. The enclosure 40 is dimensioned to enclose a printed circuit board (PCB) 50 to which is attached the major components that comprise the electronics circuit 12.

The alerting device enclosure 40, as shown in FIG. 2, is comprised of an outer side 42 and an inner side 44 that is removably attached to outer side 42. As also best shown in FIG. 2, the enclosure 40 includes an enclosure/window attachment means 46 that preferably consists of a double-sided adhesive tape 48. The tape is attached to the outer side 42 of the enclosure 40, preferably near the upper edge and lower edge of the outer surface 42. When the outer side 42 is pressed against the inner surface 62 of the windowpane 60, the two-sided adhesive tape 48 securely attaches the alerting device enclosure 40 to the windowpane 60.

The outer side 42 of the alerting device enclosure 40 further comprises indicia 52, preferably in the form of a target 54, as shown in FIG. 3. The target 54 is located so that it encompasses the location of the electrode 22. The indicia target 54 allows a person to place his/her finger or hand at an optimum location to activate the window-attached alerting device 10.

The third design configuration of the window-attached alerting device 10, as shown in FIGS. 2-4 and 6, is comprised of two major elements: an electronics circuit 12 and an alerting device enclosure 40.

The electronics circuit is comprised of the following five components: a d-c power source 14, a power ON/OFF switch 32 preferably consisting of a single-pole, single-throw switch, an electrode 22, a touch sensing circuit 24, and a buzzer 34.

Figure 6:
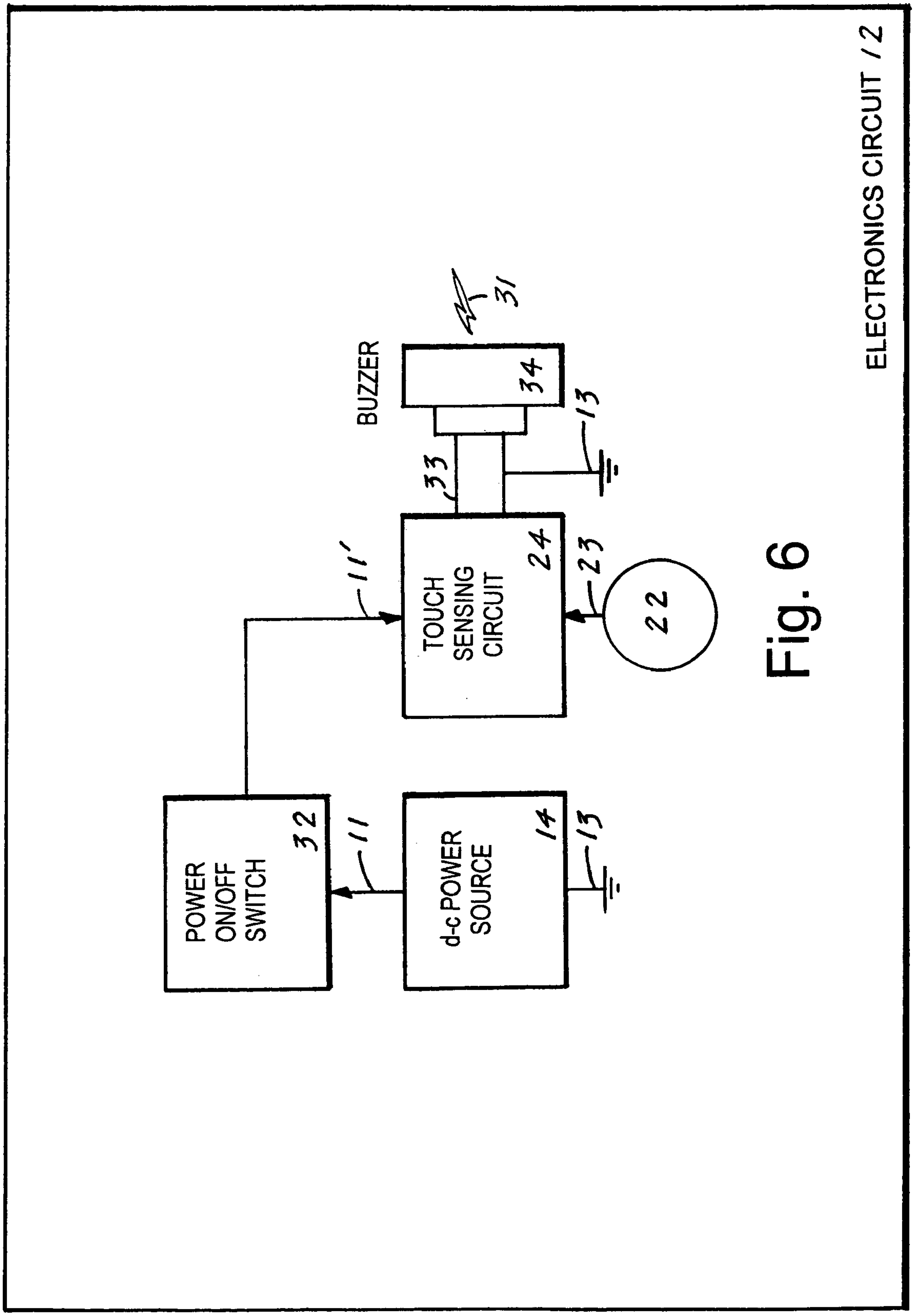
FIG. 6 is a block diagram of a simplified design of the window-attached alerting device shown in FIG. 5 that uses an audio alerting device consisting of a buzzer.

The d-c power source 14, as shown in FIG. 6, has means for producing a d-c voltage 11 that can range from 3 to 30 volts. Preferably, the d-c supply voltage 11 is provided by a 9-volt battery which is readily available and is easily connected to the electronics circuit 12.

The d-c supply voltage 11 is applied to and is controlled by the power ON/OFF switch 32. When the switch 32 is open, no power is applied to the electronics circuit 12. Conversely, when the power switch 32 is closed, the d-c supply voltage is applied through the switch 32 to produce a switched d-c voltage 11'.

The electrode 22, as shown in FIGS. 2, 3, 4 and 6, is comprised of a metal that has a high dielectric constant. The electrode 22 is attached to the inside of the outer side 42 of the enclosure 40. When a finger or hand is placed proximate to an area on the enclosure 40 that encompasses the electrode 22, the electrode 22 senses a change in capacitance. The change in capacitance causes the electrode 22 to produce a sensor activation signal 23.

The touch sensing circuit 24, as shown in FIG. 6, is applied the switched d-c voltage 11' from the power ON/OFF switch 32, and the sensor activation signal 23 from the electrode 22. The circuit 24 incorporates an integrated circuit that includes a capacitance to digital converter (CDC) that, when the circuit 24 is applied to the sensor activation signal 23, a buzzer activation signal 33 is produced that is applied to the buzzer 34 which produces the alerting device signal 31.

While the invention has been described in detail and pictorially shown in the accompanying drawings it is not to be limited to such details, since many changes and modifications may be made to the invention without departing from the spirit and the scope thereof. For example, in lieu of an audio alerting device an LED visual alerting device can be utilized. Hence, it is described to cover any and all modifications and forms which may come within the language and scope of the claims.

The invention claimed is:

1. A window-attached alerting device (10) that functions in combination with a windowpane (60) that is attached to a window frame, and that includes an inner surface (62) and an outer surface (64), wherein said alerting device (10) comprises:

a) an alerting device enclosure (40) having an outer side (42) and an inner side (44), wherein the outer side (42) has an enclosure/window attachment means that allows the enclosure (40) to be releasably attached to the inner surface (62) of the windowpane (60) where the attached alerting device enclosure (40) is protected from inclement weather or theft, b) an electronics circuit (12) that is enclosed within said alerting device enclosure (40), and having circuit means for producing an audible alerting device signal (31) that is activated by an electrode (22) that is located on an inner surface of the outer side (42) of said alerting device enclosure (40), wherein said electrode (22) is activated from the outer surface (64) of the windowpane (60) when a person's finger or hand is placed proximate to an area of the windowpane (60) that encompasses the location of the electrode (22).

2. The alerting device as specified in claim 1 wherein the enclosure/window attachment means is comprised of double-sided adhesive tape (48).

3. The alerting device as specified in claim 2 wherein the electronics circuit means includes a d-c power source consisting of a 9-volt battery.

4. A window-attached alerting device (10) that functions in combination with a windowpane (60) that is attached to a building and that includes an inner surface (62) and an outer surface (64), wherein said alerting device (10) comprises:

A. an electronics circuit (12) comprising:

a) a d-c power source (14) having means for producing a d-c supply voltage (11), b) a power ON/OFF and chime select switch (16) comprising a double-pole, double-throw, center off switch that controls the application of the supply voltage (11) from said d-c power source (14) and that selects a chime tone, said switch (16) comprising:

(1) a contact (A) connected to a contact (B), wherein both contacts are applied the supply voltage (11) from said d-c power source (14), (2) a contact (C) connected to circuit ground (13), (3) a contact (D), (4) a first pole (P1) that is ganged to a second pole (P2), wherein from the first pole (P1) is produced a switched d-c supply voltage (11'), and from the second pole (P2) is produced a chime generator mode select signal (17), c) a power rectifier and filter circuit (18) that is applied the switched d-c supply voltage (11'), wherein said circuit (18) having means for filtering the switched d-c supply voltage (11') applied from the pole (P1) of the switch (16) and producing a filtered d-c voltage (19), d) a voltage regulator circuit (20) that is applied the filtered d-c voltage (19) from said power rectifier and filter circuit (18) and having means for producing a regulated d-c voltage (21) ranging from 3 to 5 volts that is applied to the contact (D) of said power ON/OFF and chime select switch (16), e) an electrode (22) that produces a sensor activation signal (23) when activated, f) a touch sensing circuit (24) that is applied the regulated d-c voltage (21) from said voltage regulator circuit (20), and the sensor activation signal (23) from said electrode (22), wherein the output of said circuit (24) is a chime activation signal (25), g) a chime generator circuit (26) that is applied the regulated d-c voltage (21) from said voltage regulator circuit (20), and the chime generator mode select signal (17) from the pole (P2) of the power ON/OFF and chime select switch (16), wherein the output of the circuit (26) is a chime audio signal (27), h) an audio amplifier (28) that is applied the filtered d-c voltage (19) from said power rectifier and filter circuit (18), and the chime audio signal (27) from said chime generator circuit (26), wherein the output of said audio amplifier (28) is an amplified audio signal (29), and i) a loudspeaker (30) having a first input that is applied the amplified audio signal (29) from said audio amplifier (28), and a second input connected to circuit ground (13), wherein the output of said loudspeaker (30) is an alerting device signal (31), B. an alerting device enclosure (40) that is dimensioned to enclose a printed circuit board (PCB) (50) to which is attached the major components that comprise the electronics circuit (12), wherein said enclosure (40) comprises:

a) an outer side (42) that is removably attached to an inner side (44), and b) an enclosure/window attachment means (46) that is attached to the outer side (42) of said alerting device enclosure (40), wherein when the outer side (42) is pressed against the inner surface (62) of the windowpane (60) the enclosure/window attachment means (46) securely attaches said alerting device enclosure (40) to the windowpane (60).

5. The alerting device as specified in claim 4 wherein the d-c supply voltage from said d-c power source (14) can range from 3 to 30 volts.

6. The alerting device as specified in claim 5 wherein said d-c power source (14) is comprised of a 9-volt battery.

7. The alerting device as specified in claim 4 wherein said power rectifier and filter circuit (18) is designed to accept a d-c voltage or an a-c voltage, wherein the a-c voltage is subsequently rectified to produce a d-c voltage.

8. The alerting device as specified in claim 6 wherein said voltage regulator circuit (20) comprises a low dropout adjustable voltage regulator that maximizes the useful life of the 9-volt battery.

9. The alerting device as specified in claim 4 wherein when the pole (P2) of said power ON/OFF and chime select switch (16) is making contact with the contact (C) of said switch (16), said chime generator circuit (26) produces a "DING DONG" sound, and when the pole (P2) is making contact with contact (D), said circuit (26) produces a "DONG DING" sound.

10. The alerting device as specified in claim 4 wherein said electrode (22) is comprised of a metal having a high dielectric constant, wherein said electrode is attached to the inside of the outer side (42) of the alerting device enclosure (40), wherein when a finger or hand is placed proximate to an area on said alerting device enclosure that encompasses said electrode (22), said electrode senses a change in capacitance which then produces the sensor activation signal (23).

11. The alerting device as specified in claim 10 wherein said touch sensing circuit (24) is designed to include a capacitance to digital converter (CDC) that, when applied the sensor activation signal (23), produces the chime activation signal (25).

12. The alerting device as specified in claim 11 wherein said chime generator circuit (26) is designed to include a flash microcontroller that is activated when the chime activation signal (25) is applied and, depending upon the position of the pole (P2) on the power ON/OFF chime select switch (16), will produce the chime audio signal (27) that is amplified and buffered by said audio amplifier (28), which produces an amplified audio signal (29) that is subsequently applied to said loudspeaker (30) where the "DING DONG" or "DONG DING" sound is heard.

13. The alerting device as specified in claim 4 wherein the enclosure/window attachment means (46) is comprised of double-sided adhesive tape.

14. The alerting device as specified in claim 9 wherein the outer side (42) of said alerting device enclosure (40) further comprises indicia (52) that encompasses the location of the electrode (22), wherein the indicia (52) allows a person to place his/her hand at an optimum location to activate the window-attached alerting device (10).

15. A window-attached alerting device (10) that functions in combination with a windowpane (60) that is attached to a building and that includes an inner surface (62) and an outer surface (64), wherein said alerting device (10) comprises:

A. an electronics circuit (12) comprising:

a) a d-c power source (14) having means for producing a d-c supply voltage (11), b) a power ON/OFF and chime select switch (16) comprising a double-pole, double-throw, center off switch that controls the application of the supply voltage (11) from said d-c power source (14) and that selects a chime tone, said switch (16) comprising:

(1) a contact (A) connected to a contact (B), wherein both contacts are applied the supply voltage (11) from said d-c power source (14), (2) a contact (C) connected to circuit ground (13), (3) a contact (D), (4) a first pole (P1) that is ganged to a second pole (P2), wherein from the first pole (P1) is produced a switched d-c supply voltage (11') that is connected to the contact (D), and from the second pole (P2) is produced a chime generator mode select signal (17), c) an electrode (22) that produces a sensor activation signal (23) when activated, d) a touch sensing circuit (24) that is applied the switched d-c voltage (11') from the first pole (P1), and the sensor activation signal (23) from said electrode (22), wherein the output of said circuit (24) is a chime activation signal (25), e) a chime generator circuit (26) that is applied the switched d-c voltage (11') from the first pole (P1), and the chime generator mode select signal (17) from the pole (P2) of the power ON/OFF and chime select switch (16), wherein the output of the circuit (26) is a chime audio signal (27), h) an audio amplifier (28) that is applied the switched d-c voltage (11') from the first pole (P1), and the chime audio signal (27) from said chime generator circuit (26), wherein the output of said audio amplifier (28) is an amplified audio signal (29), and g) a loudspeaker (30) having a first input that is applied the amplified audio signal (29) from said audio amplifier (28), and a second input connected to circuit ground (13), wherein the output of said loudspeaker is an alerting device signal (31), B. an alerting device enclosure (40) dimensioned to enclose a printed circuit board (PCB) (50) to which is attached the major components that comprise the electronics circuit (12), wherein said enclosure (40) comprises:

a) an outer side (42) that is removably attached to an inner side (44), and b) an enclosure/window attachment means (46) that is attached to the outer side (42) of said alerting device enclosure (40), wherein when the outer side (42) is pressed against the inner surface (62) of the windowpane (60) the enclosure/window attachment means (46) securely attaches said alerting device enclosure (40) to the windowpane (60).

16. The alerting device as specified in claim 15 wherein the d-c supply voltage (11) from said d-c power source (14) can range from 3 to 30 volts.

17. The alerting device as specified in claim 15 wherein said electrode (22) is comprised of a metal having a high dielectric constant, wherein said electrode is attached to the inside of the outer side (42) of the alerting device enclosure (40), wherein when a finger or hand is placed proximate to an area on said windowpane (60) that encompasses said electrode (22), said electrode senses a change in capacitance which then produces the sensor activation signal (23).

18. A window-attached alerting device comprising:

A. an electronics circuit (12) comprising:

a) a d-c power source (14) having means for producing a d-c supply voltage (11), b) a power ON/OFF switch (32) that controls the application of the supply voltage (11) from said d-c power source (14) and that produces a switched d-c power voltage (11'), c) an electrode (22) that produces a sensor activation signal (23) when activated, d) a touch sensing circuit (24) that is applied the switched d-c voltage (11') from said power ON/OFF switch (32), and the sensor activation signal (23) from said electrode (22), wherein the output of said circuit (24) is a buzzer activation signal (33), e) a buzzer (34) that is applied the switched d-c supply voltage from said power ON/OFF switch (32), wherein said buzzer produces an alerting device signal 31, B. an alerting device enclosure (40) that is dimensioned to enclose a printed circuit board (PCB) (50) to which is attached the major components that comprise the electronics circuit (12), wherein said enclosure (40) comprises:

a) an outer side (42) that is removably attached to an inner side (44), and b) an enclosure/window attachment means (46) that is attached to the outer side (42) of said alerting device enclosure (40), wherein when the outer side (42) is pressed against the inner surface (62) of the windowpane (60) the enclosure/window attachment means (46) securely attaches said alerting device enclosure (40) to the windowpane (60).

19. The alerting device as specified in claim 5 wherein said d-c power source (14) is comprised of a 9-volt battery.

20. The alerting device as specified in claim 18 wherein said electrode (22) is comprised of a metal having a high dielectric constant, wherein said electrode is attached to the inside of the outer side (42) of the alerting device enclosure (40), wherein when a finger or hand is placed proximate to an area on said windowpane (60) that encompasses said electrode (22), said electrode senses a change in capacitance which then produces the activation signal (23).

* * * * *